(12) United States Patent
Paek et al.

(10) Patent No.: US 6,502,881 B2
(45) Date of Patent: Jan. 7, 2003

(54) GRIPPER FOR PICKING APPARATUS OF A MODULE IC HANDLER

(75) Inventors: Seung Joo Paek, Kyungki-do (KR); Do Il Kim, Choongchungnam-do (KR)

(73) Assignee: Mirae Corporation, Chunan-si (KR)

( * ) Notice: Subject to any disclaimer, the term of this patent is extended or adjusted under 35 U.S.C. 154(b) by 0 days.

(21) Appl. No.: 10/036,535

(22) Filed: Jan. 7, 2002

(65) Prior Publication Data

US 2002/0053809 A1 May 9, 2002

Related U.S. Application Data

(63) Continuation of application No. 09/495,939, filed on Feb. 2, 2000, now Pat. No. 6,347,821.

(30) Foreign Application Priority Data

Feb. 2, 1999 (KR) .............................. 99-1443

(51) Int. Cl.$^7$ .................................. B25J 15/02
(52) U.S. Cl. .................. 294/88; 294/87.1; 294/119.1; 294/907; 901/37; 901/49
(58) Field of Search .................. 294/62, 63.1, 81.6, 294/81.62, 86.4, 87.1, 88, 103.1, 119.1, 902, 907; 29/739, 741; 269/25, 32; 414/416, 730, 741; 901/30–33, 36–39, 49

(56) References Cited

U.S. PATENT DOCUMENTS

| | | | | |
|---|---|---|---|---|
| 2,896,994 A | * | 7/1959 | Fischer | 294/88 X |
| 3,199,910 A | * | 8/1965 | Bradley | 294/86.4 X |
| 3,392,851 A | | 7/1968 | Pearne et al. | 294/113.1 |
| 3,700,274 A | * | 10/1972 | Paschal et al. | 294/119.1 X |
| 4,579,380 A | * | 4/1986 | Zaremsky et al. | 294/119.1 X |
| 4,638,231 A | | 1/1987 | Monforte | 294/86.4 |
| 4,680,523 A | * | 7/1987 | Goumas et al. | 294/119.1 X |
| 4,696,503 A | * | 9/1987 | Collodel | 294/119.1 X |
| 4,699,414 A | * | 10/1987 | Jones | 294/119.1 |
| 5,520,501 A | * | 5/1996 | Kouno et al. | 294/119.1 |
| 6,089,635 A | * | 7/2000 | Lee | 294/88 |

* cited by examiner

*Primary Examiner*—Johnny D. Cherry
(74) *Attorney, Agent, or Firm*—Fleshner & Kim, LLP

(57) ABSTRACT

A picker for a module IC handler includes a plurality of grippers. Each gripper includes first and second jaws, and one or more cylinders or other actuators for driving the first and second jaws. Each gripper also includes a damping device that damps movements of the jaws to reduce an impact that can occur as the jaws grip a module IC. The grippers may also include one or more sensors for sensing when the jaws have grasped a module IC, or for sensing the position of the gripper relative to the module IC.

19 Claims, 6 Drawing Sheets

GRIPPER FOR PICKING APPARATUS OF A MODULE IC HANDLER

This application is a Continuation of application Ser. No. 09/495,939, filed Feb. 2, 2000, now U.S. Pat. No. 6,347,821.

BACKGROUND OF THE INVENTION

1. Field of the Invention

The present invention relates to a picking apparatus of a module IC (Integrated Circuit) handler used for automatically handling and testing module ICs. More particularly, the invention relates to a gripper for such a picking apparatus.

2. Description of the Conventional Art

Typically, a module IC refers to a substrate where one side or both sides of the substrate are used for mounting a plurality of ICs and/or electrical components, for example, by soldering. Typically, memory ICs are mounted on the substrate, and the module IC has a function for extending a memory capacity of a computer when the module IC is coupled to another substrate, such as a mother board of the computer.

A module IC usually provides higher added-value when sold, as compared with the sale of the individual ICs. For this reason, the IC manufacturers tend to develop it as a main product and sell it.

However, the typical module IC is relatively expensive, and thus requires high reliability to ensure customer satisfaction. This requires strict quality tests, wherein only products determined to be good pass. Module ICs that do not pass the tests are discarded.

The testing of module ICs usually begins when the module ICs are contained in a customer tray 101, as shown in FIG. 1. The module ICs 103 can be safely maintained in the customer tray 101, wherein the customer tray 101, includes a box-type body 105 having a plurality of partition walls 104. However, each insertion slot 102 provided inside of the customer tray 101 has a greater width than the width of the module ICs 103 themselves, as shown in FIGS. 1 and 2. This allows the module ICs 103 to be inserted into and removed from the slots 102 without damaging the module ICs 103.

Also, usually a manufacturer uses only one kind of customer tray 101 to accommodate various kinds of module ICs 103, each of whose widths may be different. This requires that the customer tray 101 have slots 102 wide enough to accommodate the largest of the module ICs. As a result, the slots 102 may be much wider than the most narrow of the module ICs.

In order to reduce costs the customer tray 101 is usually vacuum molded, rather than injection molded. Vacuum molding often results in relatively bad precision in the formation of the insertion slots 102.

As a result of all the above facts, when module ICs 103 to be tested are accommodated in the customer tray 101, the module ICs 103 are placed in the insertion slots 102 with arbitrarily different inclinations of the ICs 103, as shown in FIG. 2. Due to the distinct configuration of the customer tray 101, the distances between the inserted module ICs are different from each other, respectively.

When the module ICs are to be tested in an automated testing machine, the module ICs must be removed from the customer tray with automated grippers. Usually, a plurality of grippers are mounted on a movable arm of the testing machine so that the arm can grasp a plurality module ICs simultaneously.

A "picking apparatus" 110 having a plurality of gripping devices 108 is shown in FIG. 4. The picking apparatus is designed so that a spacing between the grippers matches the spacing between the module ICs in a customer tray. As shown in FIG. 5, the gripper 108 includes jaws 109, one or both of which may be movable so that the gripper can pick up modules ICs by their end edges.

Because the spacing between the grippers 108 of an automated test machine is fixed, when the machine is used to automatically test module ICs, the module ICs must be provided in trays that hold the module ICs at a precise spacing corresponding to the spacing between the grippers, like the one shown in FIG. 3. If the module ICs were held in a customer tray like the one shown in FIG. 2, the grippers would have problems effectively grasping the module ICs due to the irregular spacing between the module ICs.

Also, known types of grippers have jaws 109 made of metal, or other hard materials. The jaws of known grippers 109 can damage the module ICs due to an impact between end edges of a module IC 103 and the jaws 109. This problem is made worse when the module ICs in a customer tray are not properly aligned with the gripper jaws, as can occur when module ICs are loaded into a customer tray as shown in FIG. 2. Further, if the IC is not properly aligned when it is grasped by the jaws of a gripper, additional feeding problems can occur with the gripper tries to place the module IC in a test socket or a carrier.

Moreover, known gripper devices often do not maintain a regular grasping tension, due to lack of damping means, which also causes gripping and feeding errors.

SUMMARY OF THE INVENTION

It is an object of the present invention to provide a gripper for a picking apparatus of a module IC test handler that is capable of picking up module ICs without damaging the module ICs.

It is another object of the present invention to provide an improved gripper for a picking apparatus which is capable of grasping and moving module ICs that have been tilted at angles.

In order to accomplish the above objects, a gripper embodying the invention includes: a gripper body; a first support, a second support and a third support, all of which are vertically formed at a lower part of the gripper body; a cylinder for driving at least one jaw located between first and second supports and the second and third supports; a pair of jaws movably connected at a lower part of the cylinder and configured to grasp a module IC; damping means for reducing an impact when a module IC is gripped by the jaws; and a module IC sensor for sensing the presence of a module IC.

BRIEF DESCRIPTION OF THE DRAWINGS

The invention will be described in conjunction with the following drawings, in which like elements are identified with like reference numbers, and wherein.

DETAILED DESCRIPTION OF PREFERRED EMBODIMENTS

Figure 1:
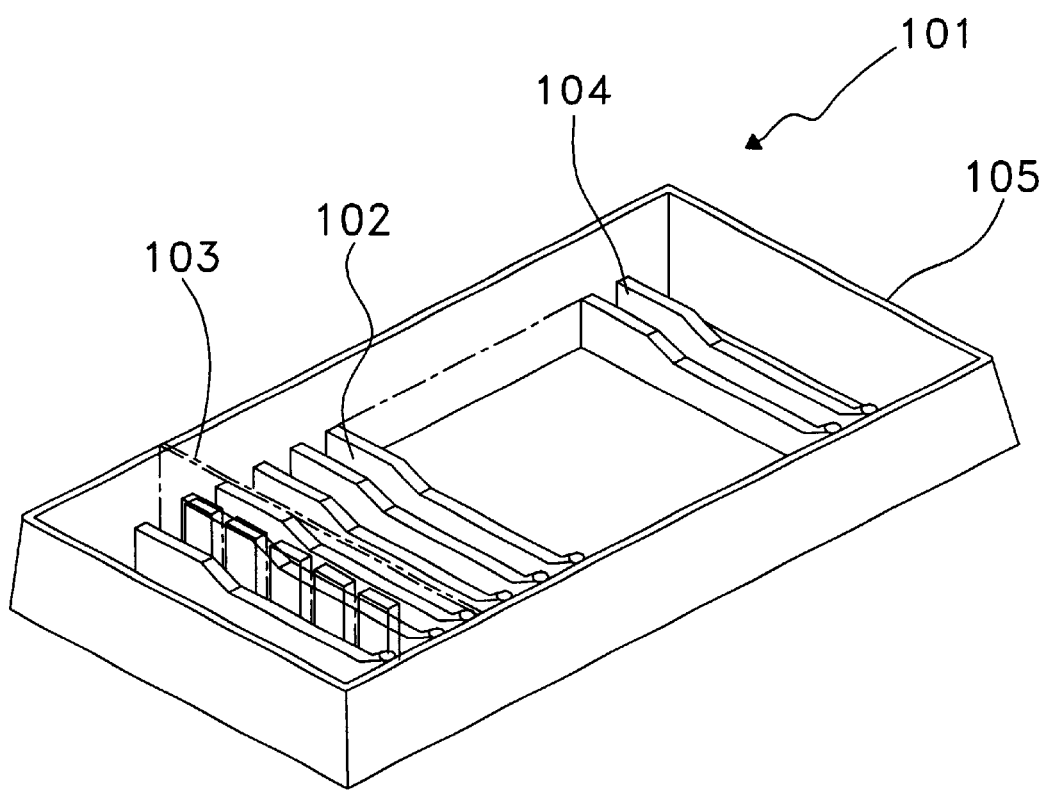
FIG. 1 is a perspective view of a customer tray for holding module ICs.
Figure 2:
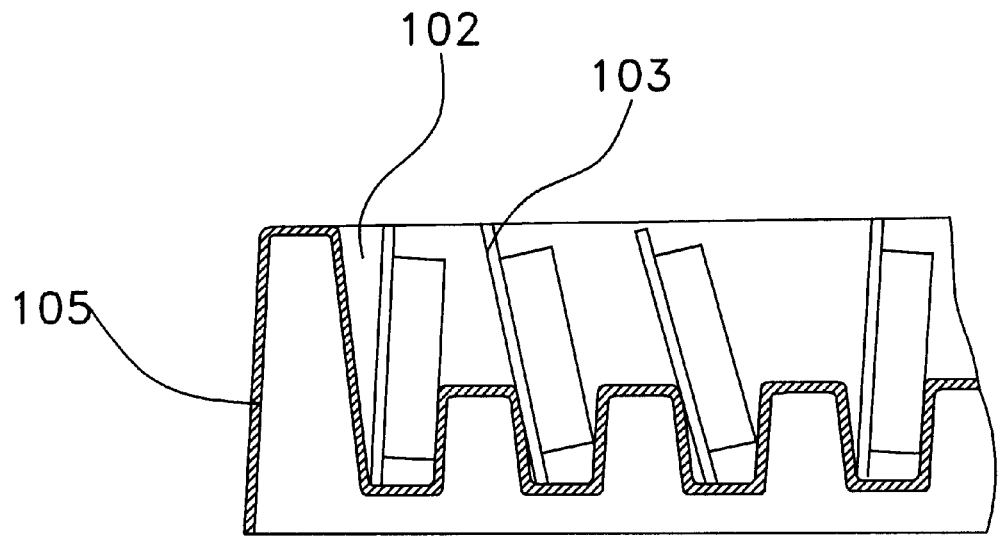
FIG. 2 is a sectional view of a customer tray having module ICs therein.
Figure 3:
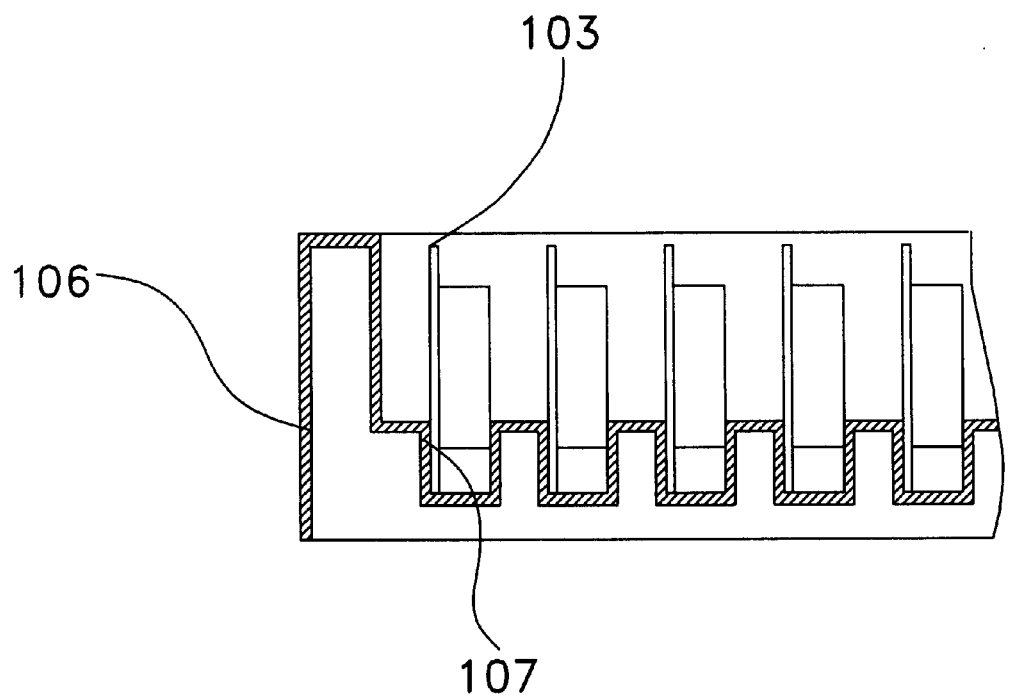
FIG. 3 is a sectional view of a customer tray having module ICs therein.
Figure 4:
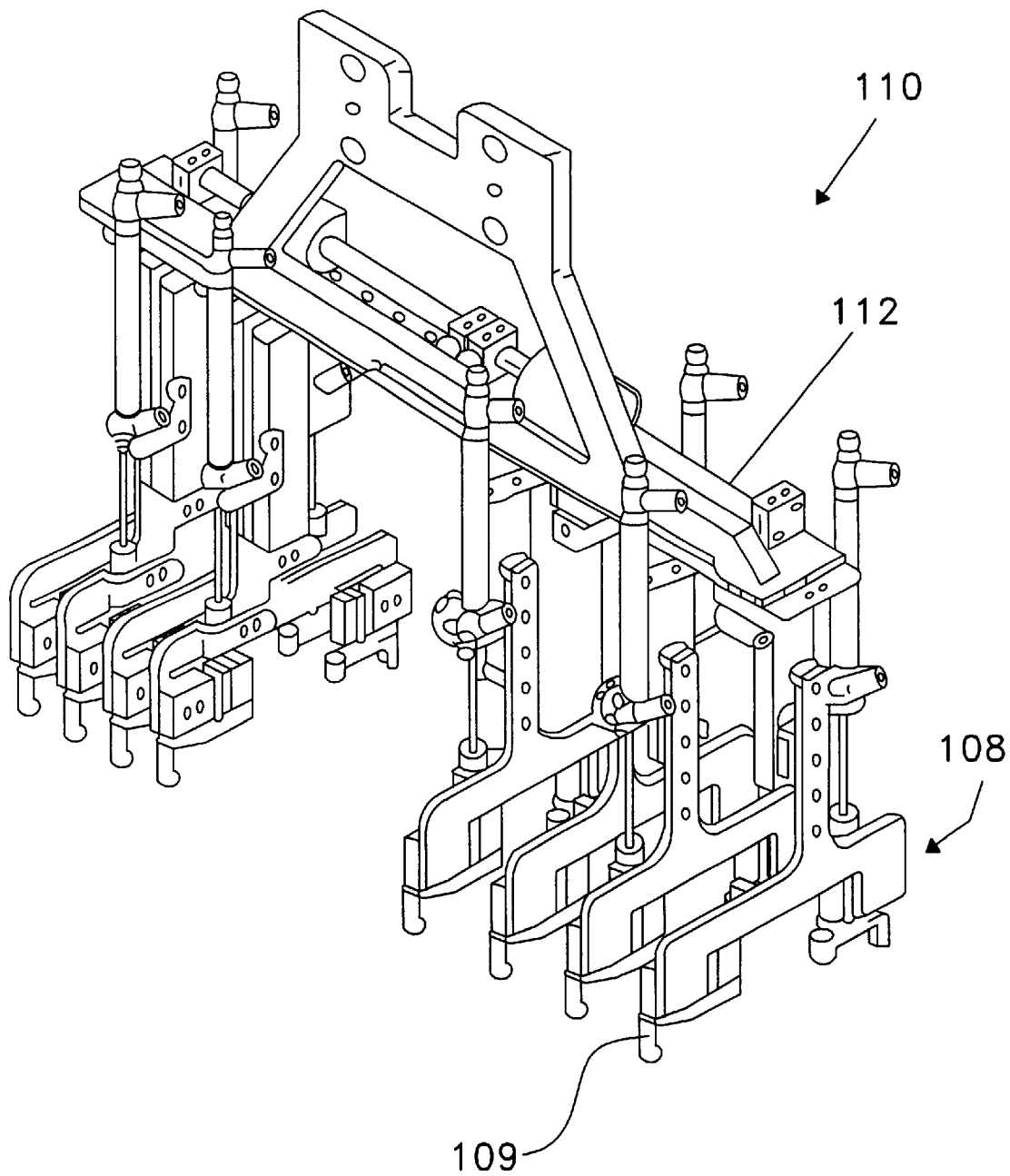
FIG. 4 is a perspective view of a background art picking apparatus for grasping and moving module ICs.
Figure 5:
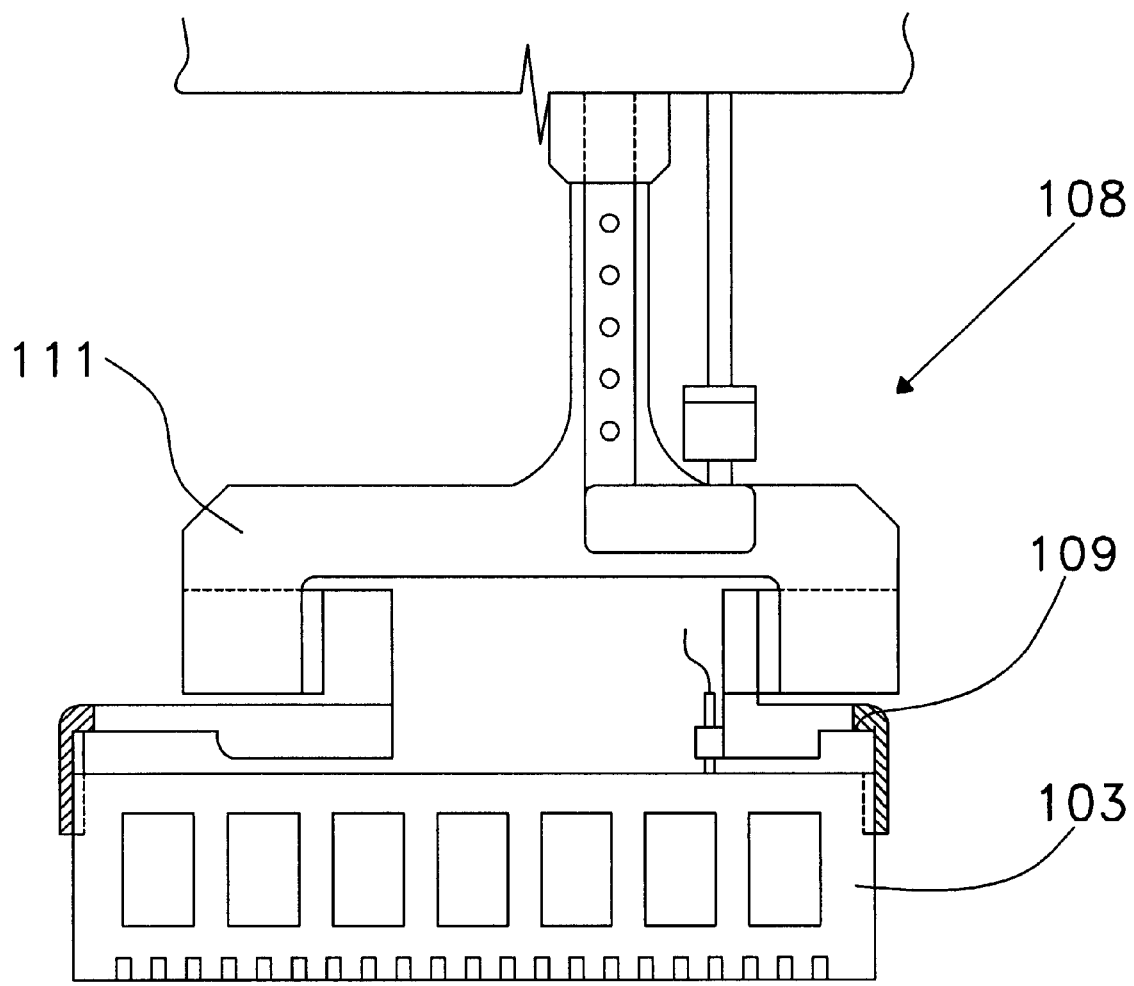
FIG. 5 is a front view of a background art picking apparatus grasping a module IC.
Figure 6:
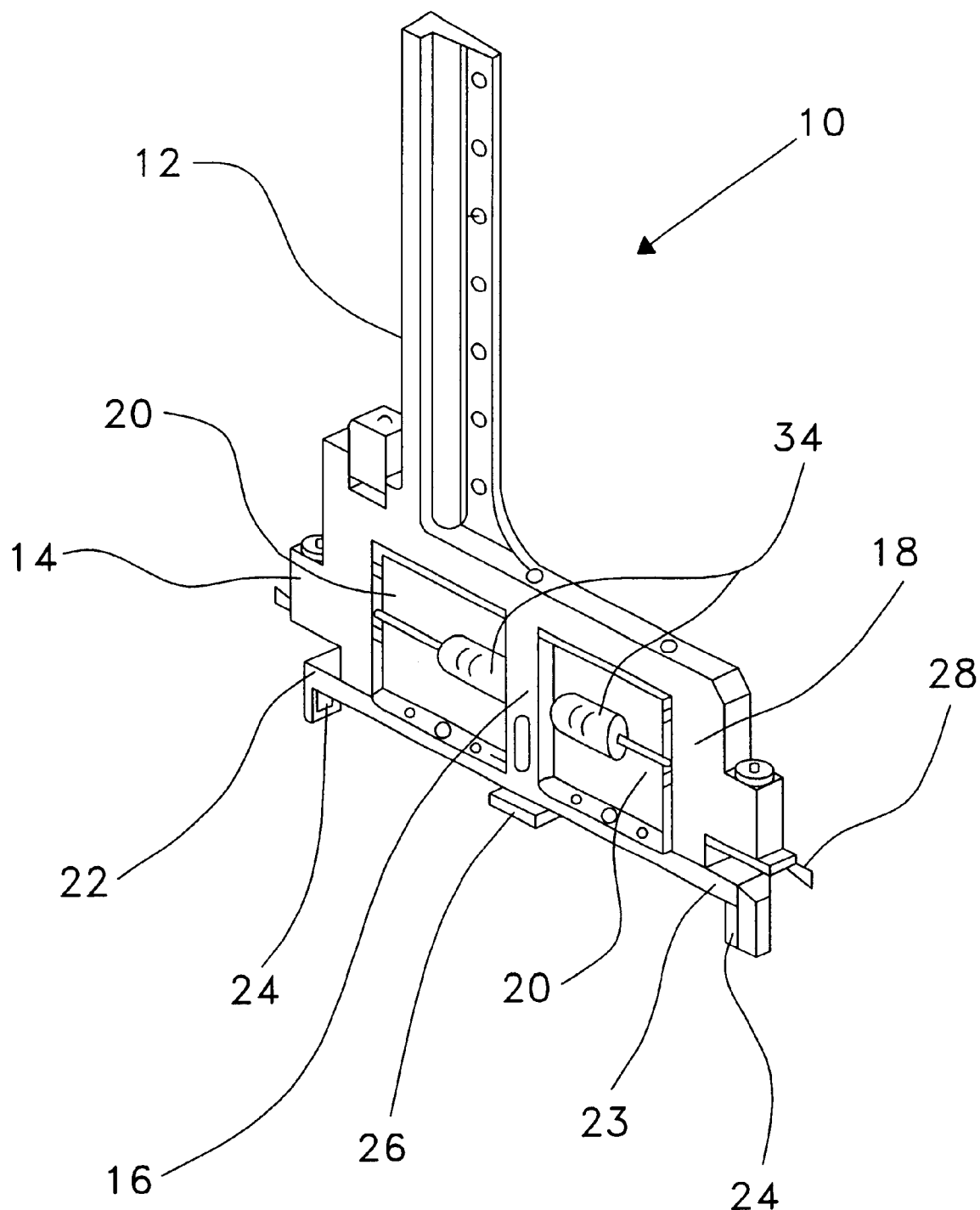
FIG. 6 is a perspective view showing a gripper for a picking apparatus of a module IC handler embodying the present invention.
Figure 7:
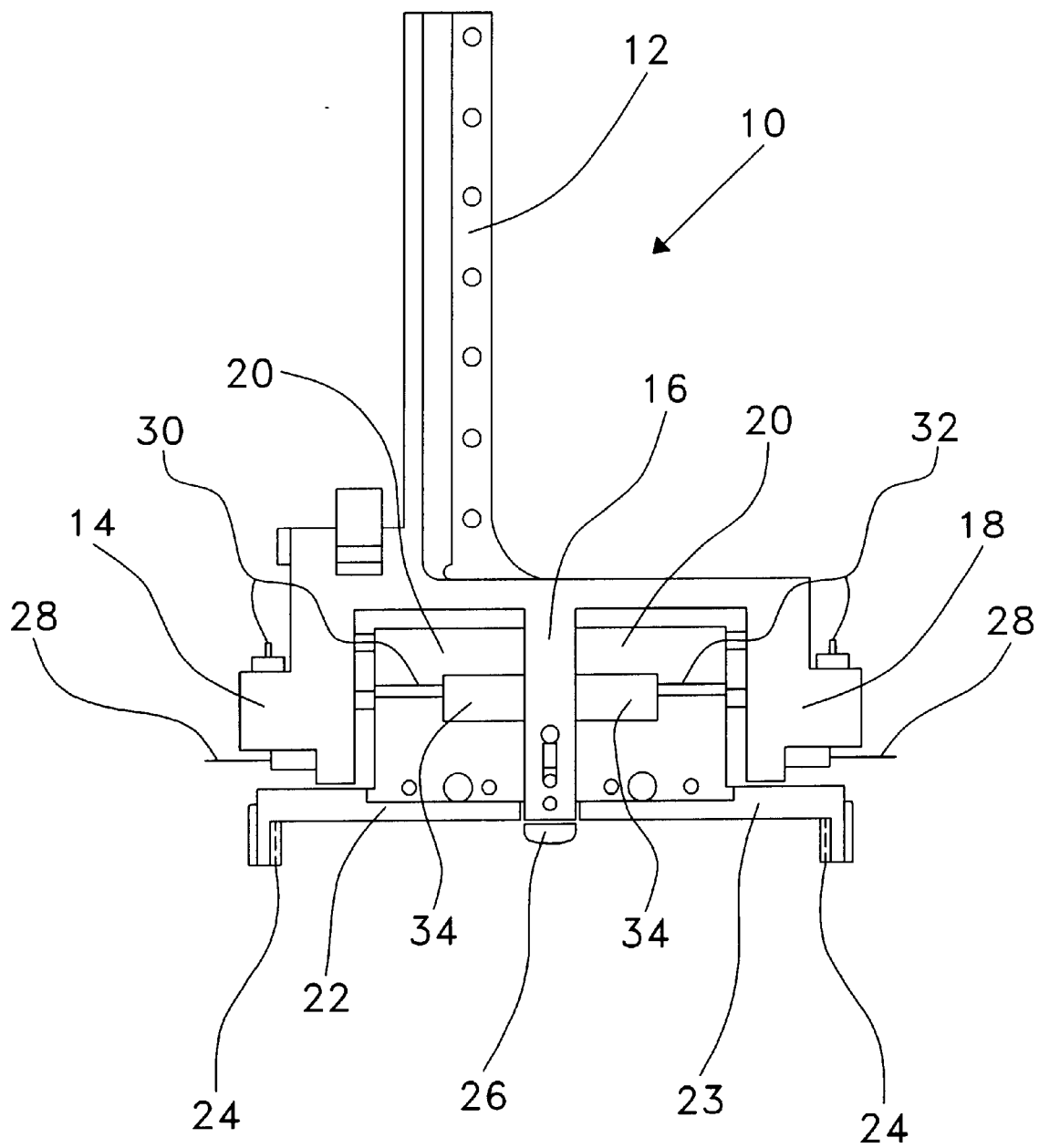
FIG. 7 is a front view showing a gripper for a picking apparatus of a module IC handler embodying the present invention.

Referring to FIGS. 6 and 7, a preferred embodiment of the present invention will be described in detail.

A gripper 10 for a picking apparatus of a module IC handler embodying the invention includes a gripper body 12, first support 14 second support 16, and third support 18. First support 14, second support 16, and third support 18 are vertically formed at the lower part of the gripper body 12.

One or more cylinders 20, which are located between first support 14 and second support 16, and between the second support 16 and third support 18, operates a pair of jaws 22, 23. The pair of jaws 22, 23 are movably connected at a lower part of the cylinder 20, and are designed to grasp the end edges of a module IC (not shown). In the embodiment shown in FIGS. 6 and 7, two cylinders are provided for moving both of the jaws 22, 23. In other embodiments, only a single cylinder could be used to move one or both of the jaws 22, 23.

Two damping devices 34 are mounted on the second support 16. The damping devices 34 are designed to reduce an impact that occurs when the jaws 22, 23 grasp a module IC (not shown). Air inlet and outlet lines 32, 30 are provided with both damping devices 34 so as to reduce an impact when the jaws 22, 23 move in right and left directions. When the jaws 22, 23 directly pick up a module IC, air pressure is provided in the air inlet and outlet lines of the cylinder 20. Therefore, the jaws 22, 23 pick up the module ICs 103 after reducing the impact occurring between the module ICs 103 and jaws 22, 23.

Module IC sensors 28, sense movement of a module IC (not shown) upon the movement of the jaws 22, 23. The module IC sensors 28 are located at sides of the first support 14 and the third support 18. A dog sensor 26 is located at a lower part of second support 16 and is designed to sense an upper edge of a module IC grasped by the jaws 22, 23.

Contact plates 24, made of elastic materials such as, rubber, silicon, urethane, etc., are mounted at inner sides of the jaws 22, 23. The contact plates 24 help to securely hold a module IC 103 and to prevent the module IC from sliding while it is held. The contact plates can help to securely hold a module IC, even when the module IC is not precisely aligned with the jaws. Also, the contact plates 24 can help to reduce an impact between the jaws 22, 23 and the end edges of a module IC.

As described above, the present invention reduces damage that may be caused to a module ICs by reducing an impact between the module IC and gripper jaws with a demping device. Also, contact plates of an elastic material on the jaws of the gripper device improve the gripping performance of the gripper and allow for gripping of module ICs that are tilted at a predetermined angle.

What is claimed is:

1. A gripper for a module IC handler, comprising:
   a gripper body;
   first and second jaws mounted on the gripper body, wherein at least one of the first and second jaws is configured to move toward and away from the other of the jaws to grip and release a module IC;
   an actuator mounted on the gripper body and configured to move at least one of the first and second jaws; and
   a damping device operatively coupled to at least one of the first and second jaws and configured to dampen an impact that occurs when the first and second jaws contact a module IC.

2. The gripper of claim 1, further comprising at least one module IC sensor mounted on the gripper body and configured to detect when at least one of the first and second jaws has contacted a module IC.

3. The gripper of claim 1, further comprising a dog sensor mounted on the gripper body and configured to sense when the gripper has been moved into a position over a module IC that will allow the gripper to grasp the module IC.

4. The gripper of claim 3, wherein the dog sensor is mounted on a lower portion of the gripper body, and wherein the dog sensor is configured to come into contact with an upper portion of a module IC as the gripper is lowered over the module IC.

5. The gripper of claim 1, wherein the actuator comprises a cylinder that is operatively coupled to at least one of the first and second jaws.

6. The gripper of claim 1, wherein the actuator comprises first and second cylinders, wherein the first cylinder is operatively coupled to the first jaw, wherein the second cylinder is operatively coupled to the second jaw, and wherein the first and second cylinders are configured to move the first and second jaws towards and away from each other.

7. The gripper of claim 6, wherein the damping device comprises a first damping device operatively coupled to the first jaw, and a second damping device operatively coupled to the second jaw.

8. The gripper of claim 1, further comprising a first contact plate mounted on the first jaw and a second contact plate mounted on the second jaw, wherein the first and second contact plates are mounted on portions of the first and second jaws that contact a module IC when the module IC is gripped by the first and second jaws.

9. The gripper of claim 8, wherein the first and second contact plates are formed of at least one of rubber, silicon, and urethane.

10. The gripper of claim 8, wherein the contact plates are configured such that the first and second jaws can securely grasp a module IC, even when the module IC is not well-aligned with the first and second jaws.

11. The gripper of claim 1, wherein the damping device comprises at least one cylinder that dampens movements of at least one of the first and second jaws.

12. A gripper for a module IC handler, comprising:
    a gripper body;
    first and second jaws mounted on the gripper body, wherein at least one of the first and second jaws is configured to move toward and away from the other of the jaws to grip and release a module IC;
    movement means for moving at least one of the first and second jaws; and
    damping means for damping movements of at least one of the first and second jaws to thereby dampen an impact that occurs when the first and second jaws contact a module IC.

13. The gripper of claim 12, further comprising sensing means for sensing when at least one of the first and second jaws has contacted a module IC, wherein the sensing means is mounted on the gripper body.

14. The gripper of claim 12, further comprising sensing means for sensing a position of the gripper relative to a module IC, wherein the sensing means is mounted at a lower portion of the gripper body.

15. The gripper of claim 14, wherein the sensing means is configured to come into contact with an upper portion of a module IC as the gripper is lowered over the module IC.

16. A picker for a module IC handler, comprising:
   a picker frame; and
   a plurality of grippers mounted on the picker frame, wherein the plurality of grippers are configured to simultaneously grasp a corresponding plurality of module ICs held in a customer tray, and wherein each gripper comprises:
      a gripper body,
      first and second jaws mounted on the gripper body, wherein at least one of the first and second jaws is configured to move toward and away from the other of the jaws to grip and release a module IC,
      an actuator mounted on the gripper body and configured to move at least one of the first and second jaws, and
      a damping device operatively coupled to at least one of the first and second jaws and configured to dampen an impact that occurs when the first and second jaws contact a module IC.

17. The picker of claim 16, wherein each of the plurality of grippers further comprises at least one module IC sensor mounted on the gripper body and configured to detect when at least one of the first and second jaws has contacted a module IC.

18. The picker of claim 16, wherein each of the plurality of grippers further comprises a dog sensor mounted on the gripper body and configured to sense when the gripper has been moved into a position over a module IC that will allow the gripper to grasp the module IC.

19. The picker of claim 16, wherein each of the plurality of grippers comprises contact plates mounted on surfaces of the first and second jaws that contact a module IC during a grasping procedure, and wherein the contact plates are made of an elastic material that allows the first and second jaws to grasp a module IC that is slightly tilted in the customer tray.

* * * * *